TEMPERATURE-COMPENSATED TRANSISTOR BIASING CIRCUITS

Filed Sept. 20, 1954

INVENTOR.
ALBERT I. ARONSON
BY H. D. Newton
ATTORNEY 2,887,540

TEMPERATURE-COMPENSATED TRANSISTOR BIASING CIRCUITS

Albert I. Aronson, Collingswood, N.J., assignor to Radio Corporation of America, a corporation of Delaware Application September 20, 1954, Serial No. 457,002

5 Claims. (Cl. 179—171)

Figure 1:
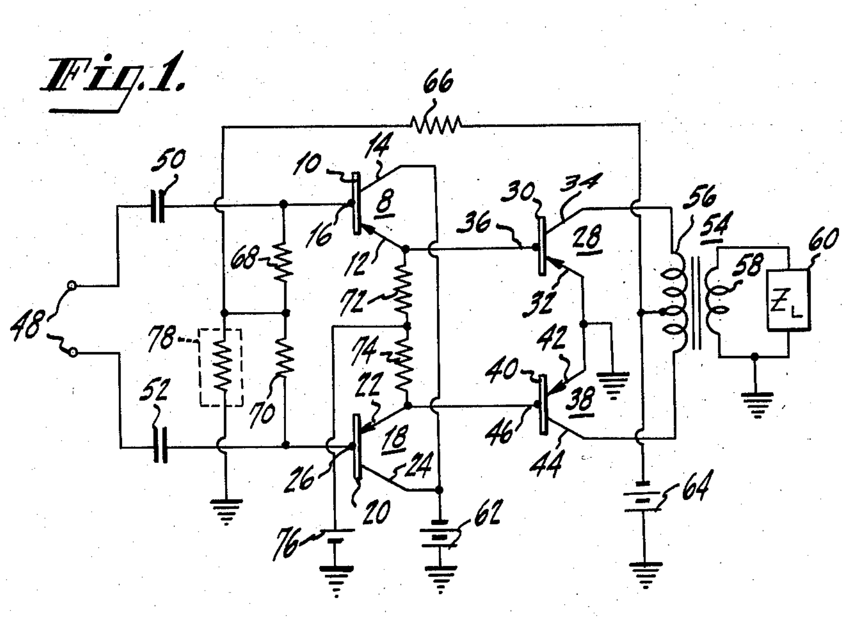

This invention relates in general to semi-conductor signal amplifying circuits and in particular to stabilization means for circuits of that type.

Semi-conductor devices such as transistors are known to be temperature sensitive. Thus, variations in the ambient temperature as well as variations due to the heat dissipation from the transistors themselves will affect their operation to a considerable extent in some cases. These temperature variations may cause changes in certain parameters and operating characteristics of the transistors to the extent that their operation may become unstable.

It is known that for most efficient operation and minimum distortion, a transistor requires a certain optimum forward bias voltage between its emitter and base electrodes. Furthermore, it has been found that this biasing voltage is sensitive to changes in temperature. Accordingly, unless provision is made to compensate for the changing requirements of the forward emitter-to-base voltage with temperature variations, distortion may result and the direct current collector current may change.

In one type of signal amplifying circuit, two transistor amplifier stages may be utilized. The first or driver stage is of the so-called common collector type, in which the input signal is applied to the base and the output signal is derived from the emitter of the transistor. The second or output stage is of the so-called common emitter type. The output signal from the first stage is applied to the base of the second transistor and the output signal is derived from the collector of the second transistor. One of the advantages of this circuit connection is that the signal distortion is relatively low. In addition, the circuit is relatively stable in operation.

Audio frequency signal amplifying circuits of the so-called push-pull type which utilize transistors are well known in the art. Because of the advantages noted above for similar single-ended circuit connections, a transistor push-pull output stage of the common emitter type may be driven by a pair of transistors of the common collector type which are also connected for push-pull operation. Like other signal amplifying circuits, however, transistor push-pull amplifier circuits of this type are also affected in operation by the sensitivity of the transistors to temperature.

As a result, since this type of amplifier has a wide range of usefulness, many methods and schemes have been tried in an attempt to compensate for the adverse affects of temperature on the operating characteristics of circuits of this type. One known method of temperature compensation for a circuit of this type is to place a temperature sensitive compensating element such as a thermistor in circuit with the base electrodes of the output stage. The use of thermistors for compensation purposes is desirable because of their reliability and low cost. By connecting them as described, however, appreciable resistance is added to the input circuit of the output transistors which is not desirable since it may increase distortion. Furthermore, since the driver stage is also subjected to temperature variations, this method will not compensate for changes in the operating characteristics of the driver transistors.

Accordingly, it is an object of the present invention to provide a semi-conductor signal amplifier wherein improved means including a temperature compensation impedance element are provided for stabilizing the circuit with temperature variations.

It is another object of the present invention to provide a push-pull signal amplifying circuit utilizing transistors which is characterized by stable and distortion-free operation over a wide range of ambient temperatures.

It is yet another object of the present invention to provide means for stabilizing the transistor push-pull driver and output stages of a signal amplifying circuit over a wide range of ambient temperatures.

These and further objects and advantages of the present invention are achieved, in general, by connecting a thermally sensitive resistance device such as, by way of example, a thermistor in common with the base electrodes of a pair of driver transistors, the emitters of which are coupled to the base electrodes of a pair of push-pull output transistors. The thermistor serves to stabilize the driver transistors, and its characteristics are also amplified and used to stabilize the output transistors as well. Accordingly, the output transistors are effectively stabilized without adding additional resistance to their input circuits. This insures relatively distortion-free and efficient circuit operation. Moreover, the advantages of a low impedance driving source, such as improved linearity, are realized.

The novel features that are considered characteristic of this invention are set forth with particularity in the appended claims. The invention itself, however, both as to its organization and method of operation, as well as additional objects and advantages thereof, will best be understood from the following description when considered in connection with the accompanying drawings, in which Figures 1 and 2 are schematic circuit diagrams of improved signal amplifying transistor circuits provided with temperature variation compensating means in accordance with the invention.

Figure 2:
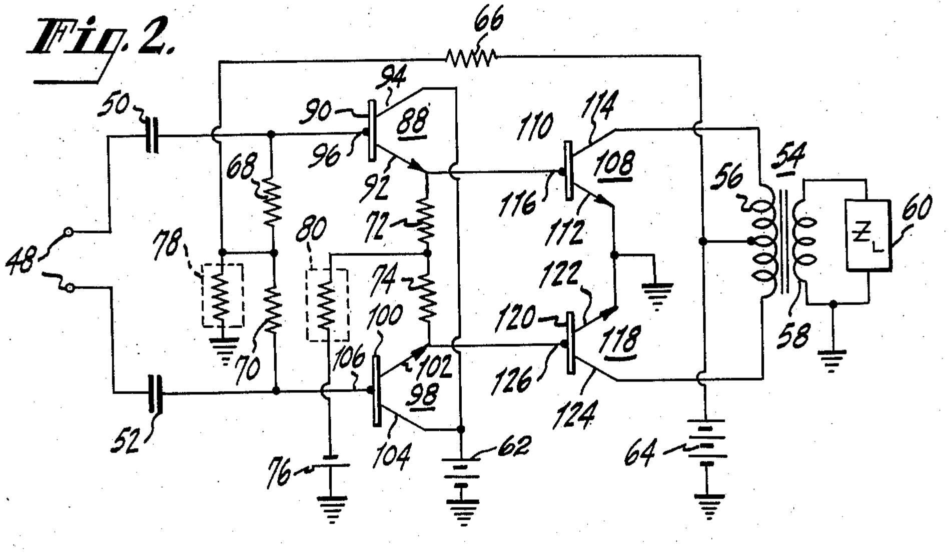

Referring now to the drawing, wherein like parts are indicated by like reference numerals in both figures, and referring particularly to Figure 1, a two-stage signal amplifying circuit which may be considered to be, for example, an audio frequency signal amplifier comprises a driver stage including two transistors 8 and 18, and a push-pull output stage which includes two transistors 28 and 38. Each of the transistors may be considered to be a P–N–P junction transistor, although it should be understood that the invention is not in any way limited to one specific type of semi-conductor device or transistor.

Each of the transistors comprises a semi-conductive body which has three electrodes cooperatively associated therewith in a well known manner. Accordingly, the transistor 8 comprises a semi-conductive body 10 and three electrodes which are designated, as is conventional, as an emitter 12, a collector 14 and a base 16. Similarly, the other transistor 18 of the driver stage comprises a semi-conductive body 20 and an emitter 22, a collector 24 and a base electrode 26. The transistor 28 of the push-pull output stage also includes a semi-conductive body 30 and an emitter 32, a collector 34 and a base 36. The other transistor 38 of the push-pull output stage similarly comprises a semi-conductive body 40 and an emitter 42, a collector 44 and a base 46.

To apply an input signal to the driver stage, the input circuit for the signal amplifier circuit embodying the invention includes a pair of input terminals 48, which are coupled through respective coupling capacitors 50 and 52 to the base electrodes 16 and 26 of the driver transistors 8 and 18, respectively. The output circuit, from which a push-pull signal may be derived, includes a transformer 54 having a primary winding 56 and a secondary winding 58. The primary winding 56 of the transformer 54 is center tapped, and has one end thereof connected with the collector 34 of the transistor 28 and the other end connected directly with the collector 44 of the other push-pull transistor 38. One end of the secondary winding 58 of the transformer 54 is connected to a point of fixed reference potential or ground for the system as shown, while its other end is connected to utilization means such as illustrated by a load impedance element 60, the lower end of which is returned to system ground.

Collector biasing potentials for the driver transistors 8 and 18 are provided by a battery 62, the positive terminal of which is grounded as shown. The negative terminal of the battery 62 is connected directly with the collectors 24 and 14 of the driver transistors 18 and 8 respectively. Collector biasing potentials for the output transistors are provided by a battery 64, the positive terminal of which is also grounded. The negative terminal of the battery 64 is connected through the center tap and the lower half of the primary winding 56 to the collector 44 and through the center tap and the upper half of the primary winding 56 to the collector 34. The battery 64 also serves as a base biasing source for the driver transistors 8 and 18. To this end, the negative terminal of the battery 64 is connected through a resistor 66 to the junction of a pair of biasing resistors 68 and 70, which are connected in series with the base electrodes 16 and 26 of the two driver transistors 8 and 18 respectively.

The circuit connections for the push-pull output stage are completed by connecting the emitters together to a common point of ground potential as shown. For normal use the biasing arrangement is such that the output stage is operated class B. It should be understood, however, that the invention is equally applicable to other classes of transistor operation.

As an aid to providing stabilization of the operating characteristics of the driver stage with temperature variations, the emitters 12 and 22 are connected together through a pair of serially connected resistors 72 and 74. The junction of the resistors 72 and 74 is returned to a source of slightly positive potential such as illustrated by a battery 76, the negative terminal of which is grounded. The battery 76 is chosen such that the junction point of the resistors 72 and 74 is approximately 0.5 volt positive at room temperature.

In accordance with the present invention, a temperature compensating resistance device 78, such as a thermistor, is connected from the junction of the resistors 68 and 70 to ground and serves to compensate both the driver and output stages for variations in ambient temperature. Thermistors, as is well known, are made from a semi-conductive material such as uranium oxide or silver sulfide. The specific resistance of such devices decreases rapidly with increases in temperature, that is, they are referred to as having a negative temperature coefficient.

Experimental evidence indicates that one of the prime factors or characteristics of transistors which makes their optimum bias highly temperature sensitive is the leakage saturation current from collector to base ($I_{co}$) of the transistor. Without the thermistor connected in the circuit as shown, a rise in temperature, for example, would cause an increase in the leakage saturation current flow of the transistors 8 and 18. The leakage saturation current flows through the base lead of the transistor. Since the base lead of the transistor has resistance, a voltage drop is created across this resistance as well as any external circuit resistance, due to the flow of leakage saturation current, which creates a bias voltage for the transistor. Accordingly, a bias which varies with temperature is established with the variations of leakage saturation current flow. It is in this manner that the bias for the transistor varies with temperature, which may cause unstable and unreliable operation.

It will be assumed initially that the thermistor 78 has not been added to the circuit. Accordingly, when the temperature increases, the junction of the resistors 68 and 70 becomes more negative, increasing the forward bias between the emitter and the base of the transistors 8 and 18. At the same time, moreover, the temperature variations will affect the operation of the output transistors 28 and 38 and cause their collector current to vary. The net result is that without the use of the thermistor 78, the circuit operation is relatively unstable as the ambient temperature changes.

By provision of the present invention, however, an increase in temperature will cause the specific resistance of the thermistor 78 to decrease rapidly. Hence, a compensating voltage is developed which causes the voltage at the junction of the resistors 68 and 70 to become less negative, which will compensate for the increases in temperature. Consequently, the emitter-to-base forward bias of the driver transistors 8 and 18 remains substantially constant, and they will be stable in operation over a wide range of temperature variation.

At the same time, moreover, due to the inclusion of the thermistor 78 as shown and described, and in accordance with the teachings of the invention, the voltage at the junction of the resistors 72 and 74 becomes more positive. Thus, the thermally variable voltage developed across the thermistor 78 is amplified and is used, in accordance with the invention, to stabilize the operating point of the push-pull transistors 28 and 38. Accordingly, the operating point of the transistors 28 and 38 of the push-pull output stage will be stabilized despite wide variations in ambient temperature. As a result, the collector current of both of these transistors will remain substantially constant without it being necessary, in accordance with the invention, to add resistance to their input circuit. Thus the input direct-current resistance of the output stage is kept small which results in relatively stable and distortion-free circuit operation. Furthermore, since the impedance of the driving source is relatively low the linearity of the circuit operation is improved.

As described, therefore, it is seen that the invention provides an effective means for stabilizing both the driver and output stages of a signal amplifying circuit. This result is accomplished with relatively simple circuit connections and with a circuit which utilizes a minimum number of circuit components. As a result, stable and distortion-free operation over a wide range of temperature variation characterizes a signal amplifying circuit embodying the teachings of this invention.

As mentioned hereinbefore, while the invention has been described and is particularly well adapted for class B operation, it is equally applicable to other classes of transistor operation. Furthermore, the invention is not restricted to push-pull type operation and could easily be adapted to a single ended pulse amplifier circuit. Thus, if the same circuit connections are used with a single transistor driving a single output transistor, a thermistor connected in circuit with the base of the driver transistor will provide compensation means for both the driver and output stages. It should also be understood that transistors of an opposite conductivity type to the N conductivity type (i.e., P–N–P junction transistors) illustrated in Figure 1 could be used. This type circuit is illustrated in Figure 2 of the drawing, reference to which is now made.

In Figure 2, a two-stage amplifier circuit of the same general type as the one illustrated in Figure 1 comprises a driver stage including two transistors 88 and 98 of P type conductivity and a push-pull output stage which includes two transistors 108 and 118 which are also of P type conductivity. Each of the transistors may be considered to be of the N–P–N junction type.

Each of the transistors comprises a semi-conductive body which has three electrodes cooperatively associated therewith in a well known manner. Accordingly, the transistor 88 comprises a semiconductive body 90 and an emitter 92, a collector 94 and a base 96. Similarly, the other transistor 98 of the driver stage comprises a semi-conductive body 100 and an emitter 102, a collector 104 and a base 106. The transistor 108 of the push-pull output stage also includes a semi-conductive body 110 and an emitter 112, a collector 114 and a base 116. The other transistor 118 of the push-pull output stage similarly comprises a semi-conductive body 120 and an emitter 122, a collector 124 and a base 126.

The circuit connections for the driver and push-pull output stages of the signal amplifying circuit illustrated in Figure 2 are seen to be substantially identical to the ones for the amplifying circuit illustrated in Figure 1. Accordingly, and in accordance with the teachings of the invention, the thermistor 78 is connected from the junction of the resistors 68 and 70 to a point of ground potential. One difference, however, is that since opposite conductivity transistors are utilized, the polarity of each of the biasing batteries 62, 64 and 76 is reversed. In addition, to provide temperature compensation over a still wider range of temperature variation, an additional thermistor is connected from the junction of the emitter stabilizing resistors 72 and 74 to the negative terminal of the biasing battery 76. This assures that the voltage at the junction of the resistors 72 and 74 becomes more negative as the ambient temperature increases. The additional thermistor 80 may also be used, it should be understood, in the circuit illustrated in Figure 1. In general, however, improved and highly reliable temperature compensation is achieved with the use of the thermistor 78 alone.

Signal amplifying circuits connected as described herein are capable of stable and distortion-free operation despite relatively large changes in ambient temperature. Accordingly, the invention may find wide use wherever elevated temperatures are encountered or wherever a high degree of circuit reliability is required.

What is claimed is:

1. In a signal amplifying circuit, the combination with a driver stage including a first semi-conductor device connected as a common collector amplifier and having a first emitter, a first collector and a first base electrode, and an output stage including a second semi-conductor device connected as a common emitter amplifier and having a second emitter, a second collector and a second base electrode, said transistors being of the same conductivity type, of signal input circuit means coupled with said first base electrode, signal output circuit means coupled with said second collector electrode, direct current and signal conductive circuit means connecting said first emitter electrode with said second base electrode, means providing biasing potentials for said devices including a pair of terminals one of which is connected with the collector electrodes of said first and second devices, and means providing temperature compensation for said first and second devices including a passive thermally responsive variable impedance element direct-current conductively connected between said first base electrode and the other of said pair of terminals.

2. In a signal amplifying circuit including means providing a point of reference potential therein, the combination with a driver stage including a first and a second transistor each of which includes an emitter, a base and a collector electrode, said first and second transistors being connected as common collector amplifiers, and a push-pull output stage including a third and a fourth transistor each of which includes an emitter, a base and a collector electrode, said transistors all being of the same conductivity type, of a signal input circuit coupled with the base electrodes of said first and second transistors, a signal output circuit coupled with the collector electrodes of said third and fourth transistors, means connecting the emitter electrode of said first transistor with the emitter electrode of said second transistor, a first direct current and signal conductive circuit means connecting the emitter electrode of said first transistor with the base electrode of said third transistor, a second direct current and signal conductive circuit means connecting the emitter electrode of said second transistor with the base electrode of said fourth transistor, means for applying biasing potentials to the electrodes of said driver and output stages including a first impedance element serially connected between the base electrodes of said first and second transistors, and means providing temperature compensation for said driver and output stages including a second impedance element having a negative temperature coefficient connected from an intermediate point on said first impedance element to said point of reference potential.

3. In a multi-stage signal amplifying circuit including means providing a point of ground potential therein, the combination with a driver stage including a first and a second transistor of one conductivity type each of which includes an emitter, a base and a collector electrode, said first and second transistors being connected as common collector amplifiers, and a push-pull output stage including a third and a fourth transistor of said one conductivity type each of which includes an emitter, a base and a collector electrode, of a signal input circuit coupled with the base electrodes of said first and second transistors, a signal output circuit coupled with the collector electrodes of said third and fourth transistors, means including a first impedance element connecting the emitter electrode of said first transistor with the emitter electrode of said second transistor, a first direct current and signal conductive circuit means connecting the junction of the emitter electrode of said first transistor and said first impedance element with the base electrode of said third transistor, a second direct current and signal conductive circuit means connecting the junction of the emitter electrode of said second transistor and said first impedance element with the base electrode of said fourth transistor, means connecting the emitter electrodes of said third and fourth transistors to said point of ground potential, means for applying biasing potentials to the electrodes of said driver and output stages including a second impedance element serially connected between the base electrodes of said first and second transistors, and means providing temperature compensation for said driver and output stages including a first thermistor connected from an intermediate point on said second impedance element to said point of ground potential and a second thermistor connected to an intermediate point on said first impedance element.

4. A signal amplifying circuit comprising, in combination, a driver stage including a first and a second semi-conductor device each of which includes an emitter, a base and a collector electrode, said first and second semi-conductor devices being connected as common collector amplifiers, a push-pull output stage including a third and a fourth semi-conductor device each of which includes an emitter, a base and a collector electrode, said semi-conductor devices all being of the same conductivity type, signal input circuit means coupled with the base electrodes of said first and second devices, signal output circuit means coupled with the collector electrodes of said third and fourth device, direct-current conductive impedance means connecting the emitter electrode of said first device with the emitter electrode of said second device, a first direct current and signal conductive circuit means connecting the emitter electrode of said first device with the base electrode of said third device, a second direct current and signal conductive circuit means connecting the emitter electrode of said second device with the base electrode of said fourth device, means for applying biasing potentials to the electrodes of said driver and output stages, means connecting the base electrode of said first device with the base electrode of said second device, means connecting the emitter electrode of said third device in common with the emitter electrode of said fourth device, and means providing temperature compensation for both of said driver and output stages including a thermally responsive variable impedance element connected in series for direct-current with the base electrodes of said first and second devices.

5. In a signal amplifying circuit the combination with a driver stage including a first and a second semi-conductor device each of which includes an emitter, a base and a collector electrode, said first and second semi-conductor devices being connected as common collector amplifiers, and an output stage including a third and a fourth semi-conductor device each of which includes an emitter, a base and a collector electrode, said semi-conductor devices all being of the same conductivity type, of signal input circuit means coupled with the base electrodes of said first and second devices, signal output circuit means coupled with the collector electrodes of said third and fourth devices, a first direct current and signal conductive circuit means connecting the emitter electrode of said first device with the base electrode of said third device, a second direct current and signal conductive circuit means connecting the emitter electrode of said second device with the base electrode of said fourth device, and means providing temperature compensation for said driver and output stages including a thermally responsive variable impedance element direct-current conductively connected in series with the base electrodes of said first and second semi-conductor devices.

References Cited in the file of this patent

UNITED STATES PATENTS

| | | |
|---|---|---|
| 2,070,071 | Stromeyer | Feb. 9, 1937 |
| 2,313,096 | Shepard | Mar. 9, 1943 |
| 2,431,306 | Chatterjea et al. | Nov. 25, 1947 |
| 2,652,460 | Wallace | Sept. 15, 1953 |
| 2,663,806 | Darlington | Dec. 22, 1953 |
| 2,663,830 | Oliver | Dec. 22, 1953 |

FOREIGN PATENTS

| | | |
|---|---|---|
| 140,501 | Sweden | May 26, 1953 |

OTHER REFERENCES

Shea text, "Principles of Transistor Circuits," pp. 82, 153, and 165–181, pub. 1953 by John Wiley & Sons, Inc., N.Y. (Copy in Div. 69.)

Shea text of record, add. page 121.